United States Patent
Su

(10) Patent No.: US 9,412,932 B2
(45) Date of Patent: Aug. 9, 2016

(54) PIEZOELECTRICITY CERAMIC, SINTER, METHOD FOR MANUFACTURING SAME, AND PIEZOELECTRICITY CERAMIC DEVICE USING SAME

(71) Applicant: Shaohua Su, Shenzhen (CN)

(72) Inventor: Shaohua Su, Shenzhen (CN)

(73) Assignees: AAC Acoustic Technologies (Shenzhen) Co., Ltd., Shenzhen (CN); AAC Acoustic Technologies (Suzhou) Co., Ltd., Suzhou (CN)

( * ) Notice: Subject to any disclaimer, the term of this patent is extended or adjusted under 35 U.S.C. 154(b) by 344 days.

(21) Appl. No.: 14/197,392

(22) Filed: Mar. 5, 2014

(65) Prior Publication Data

US 2014/0285062 A1    Sep. 25, 2014

(30) Foreign Application Priority Data

Mar. 20, 2013   (CN) .......................... 2013 1 0091453

(51) Int. Cl.

| | |
|---|---|
| H01L 41/187 | (2006.01) |
| C04B 35/00 | (2006.01) |
| B01J 6/00 | (2006.01) |
| B32B 18/00 | (2006.01) |
| C04B 35/472 | (2006.01) |
| C04B 35/491 | (2006.01) |
| C04B 35/632 | (2006.01) |
| C04B 35/634 | (2006.01) |
| C04B 35/626 | (2006.01) |

(52) U.S. Cl.
CPC .............. *H01L 41/1876* (2013.01); *B01J 6/001* (2013.01); *B32B 18/00* (2013.01); *C04B 35/472* (2013.01); *C04B 35/491* (2013.01); *C04B 35/62625* (2013.01); *C04B 35/62675* (2013.01); *C04B 35/632* (2013.01); *C04B 35/634* (2013.01); *C04B 2235/326* (2013.01); *C04B 2235/3215* (2013.01); *C04B 2235/3251* (2013.01); *C04B 2235/3279* (2013.01); *C04B 2235/3282* (2013.01); *C04B 2235/3418* (2013.01); *C04B 2235/5445* (2013.01); *C04B 2235/5454* (2013.01); *C04B 2235/6025* (2013.01); *C04B 2235/6567* (2013.01); *C04B 2235/77* (2013.01); *C04B 2235/96* (2013.01); *C04B 2237/346* (2013.01)

(58) Field of Classification Search
USPC ............ 310/311–371; 501/134; 252/62.9 PZ, 252/62.9 R
See application file for complete search history.

(56) References Cited

U.S. PATENT DOCUMENTS

2008/0061905 A1* 3/2008 Ishikawa ............... C04B 35/465
                                                    333/132

\* cited by examiner

*Primary Examiner* — Thomas Dougherty
(74) *Attorney, Agent, or Firm* — IPro, PLLC; Na Xu; Qian Gu

(57) ABSTRACT

The present disclosure provides a piezoelectricity ceramic material. The piezoelectricity ceramic material includes main components that are represented by a general chemical formula of $PbZr_aTi_b(Nb_{2/3}Ni_{1/3})_{1-a-b}O_3 + c\%BaW_{0.5}Cu_{0.5}O_3$ $d\%SiO_2$ and satisfy the following condition: $0.1 \leq a \leq 0.4$, $0.2 \leq b \leq 0.5$, $0.1 \leq c \leq 3$, and $0.05 \leq d \leq 1$. The low-temperature sintering adopted by the present disclosure reduces energy consumption and reduces the volatilization of PbO, which avoids the fluctuation and deviation of the ceramic components, reduces the pollution to then environment caused by volatilization, and reduces the corrosion to the sintering machine as well. Furthermore, the present disclosure provides a piezoelectricity ceramic sinter and a method for processing the same, as well as a piezoelectricity ceramic device. In a multilayer device, the device cost is greatly reduced.

10 Claims, 3 Drawing Sheets

PIEZOELECTRICITY CERAMIC, SINTER, METHOD FOR MANUFACTURING SAME, AND PIEZOELECTRICITY CERAMIC DEVICE USING SAME

FIELD OF THE INVENTION

The present disclosure generally relates to a piezoelectricity ceramic material, sinter, and piezoelectricity ceramic device with excellent piezoelectric properties, and a method for processing a sinter from the piezoelectricity ceramic material.

DESCRIPTION OF RELATED ART

Since the lead zirconate-titanate (PZT) piezoelectricity ceramic was first found in 1954, many countries such as US, Japan, and Holland have made exhaustive studies on the piezoelectricity ceramic system, and with the development of the studies, a series of PZT piezoelectricity ceramic materials with excellent properties have been derived and the application scope of piezoelectricity ceramic materials has also been greatly expanded. Among them, ternary or quaternary system piezoelectricity ceramic based on PZT modified by various elements emerge at the right moment.

In order to obtain high-performance piezoelectricity ceramics, the modified A site (Pb) or B site (Zr, Ti) of Pb(Zr, Ti)$O_3$ are mostly partially replaced and the ratio of Zr/Ti is changed in order to adjust the properties now. It is processed mostly by common solid sintering, that is, by blending a precalcined powder and a certain amount of a binder, drypressing and then sintering the mixture. The sintering method cannot satisfy the increasingly diversified and complicated requirements of piezoelectric members and devices, requires high sintering temperature (1200° C.-1300° C.), and is not favorable to reducing cost. Moreover, PbO is highly volatized during sintering, which not only damages human health and pollutes the environment, but also results in the deviation of actual composition and thus changes the properties. The volatilization of lead also corrodes the heating rod of the sintering machine and reduces the service life of the machine.

With the development of the surface mount technology (SMT), multi-layer piezoelectricity ceramics gain popularity in the market due to their high efficiency, miniaturization, and function integration. This requires that the inner electrode and the ceramic must be co-fired together. The melting point of silver is 961° C. Based on the aforesaid temperature, Ag/Pd alloy is generally used as the co-fired electrode. With the increase of Pd content, the price of Pd will result in a sharp rise in the product cost.

SUMMARY OF THE INVENTION

In order to solve the aforesaid problems, the present disclosure provides a piezoelectricity ceramic material which comprises main components that are represented by a general chemical formula of
$PbZr_aTi_b(Nb_{2/3}Ni_{1/3})_{1-a-b}O_3 + c\%BaW_{0.5}Cu_{0.5}O_3 + d\%SiO_2$ and satisfy the following condition:
$0.1 \leq a \leq 0.4$, $0.2 \leq b \leq 0.5$, $0.1 \leq c \leq 3$, and $0.05 \leq d \leq 1$.

A method for processing a piezoelectricity ceramic sinter, comprises the following steps:

Material preparation: providing the components of the piezoelectricity ceramic material according to a chemical formula of $PbZr_aTi_b(Nb_{2/3}Ni_{1/3})_{1-a-b}O_3$ and pulverizing the components into a powder, the components including $Pb_3O_4$, $TiO_2$, $ZrO_2$, $Nb_2O_5$, NiO, CuO, $BaCO_3$, $WO_3$, and $SiO_2$;

Mixing: adding distilled water into the aforesaid processed powder in a mass ratio of 1:1, mixing them for 8 h, and then oven-drying the mixture;

Calcination: calcining the aforesaid oven-dried product at 780-850° C. for 3 h to synthesize a calcined product;

Addition of low-temperature assistant and pulverizing: adding a low-temperature assistant into the calcined product according to a mass percentage of $c\%BaW_{0.5}Cu_{0.5}O_3 + d\%SiO_2$, and then pulverizing and oven-drying them to form a mixture;

Pulping: adding a binder, a plasticizer, a dispersing agent, and a solvent into the aforesaid mixture and mixing them to form a ceramic pulp;

Forming: debubbling the ceramic pulp and then casting it into a ceramic film;

Laminating: laminating the aforesaid ceramic film to form a laminated product; sintering: firing the laminated product at 900-950° C. for 3 h to form a piezoelectricity ceramic sinter.

A piezoelectricity ceramic device, which is formed from the aboved piezoelectricity ceramic sinter through electrode polarization.

As compared to the related art, the low-temperature sintering adopted by the present disclosure reduces energy consumption and reduces the volatilization of PbO, which avoids the fluctuation of the ceramic components and the deviation from the designed composition, reduces the pollution to the environment caused by volatilization, and reduces the corrosion to the sintering machine as well. In a multi-layer device, Ag/Pd alloy is generally used as then inner electrode in order to prevent the electrode from being oxidized during the sintering, and if the sintering temperature is reduced, the proportion of Pd in the Ag/Pd alloy will be reduced, and even a pure Ag electrode can be used, which greatly reduces the device cost. The particle size control and the low melting point additive reduce the sintering temperature while ensuring the piezoelectric properties of the material and leading to a low cost and a simple process, which facilitates industrialized application.

Figure 1:
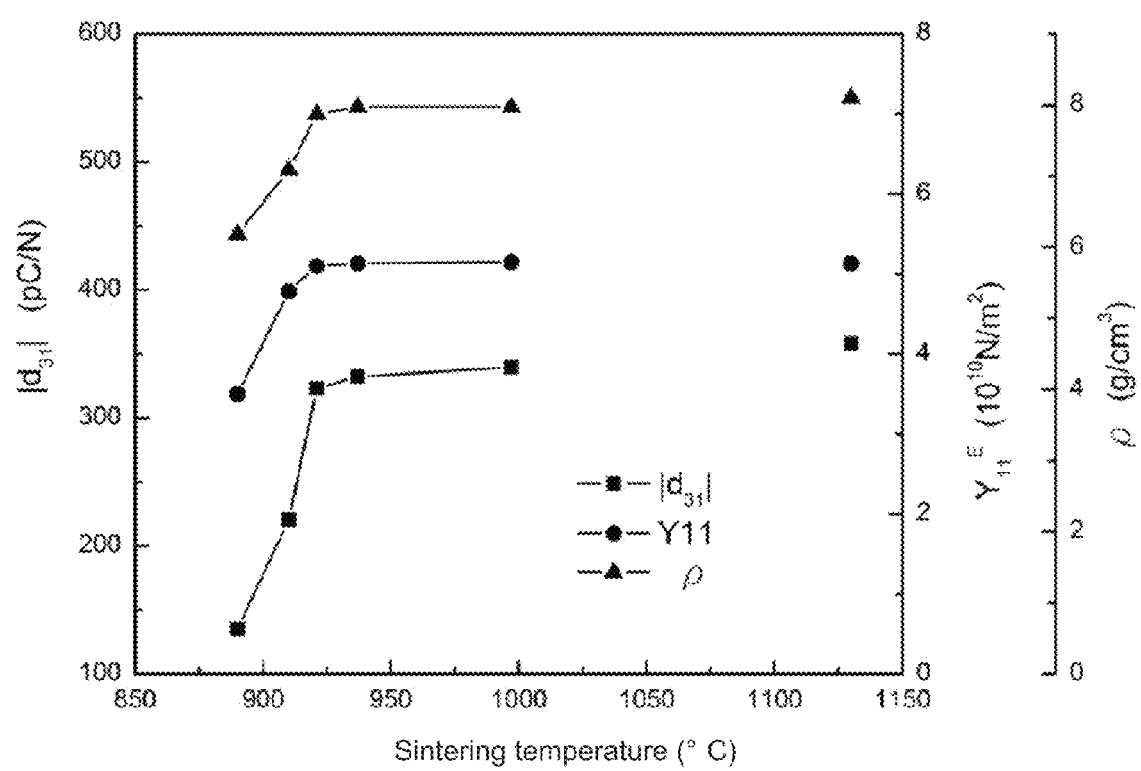
FIG. 1 is a schematic view showing curves comparing the properties of ceramics at different sintering temperatures.

Many aspects of the embodiments can be better understood with reference to the drawings mentioned above. The components in the drawings are not necessarily drawn to scale, the emphasis instead being placed upon clearly illustrating the principles of the present disclosure. Moreover, in the drawings, like reference numerals designate corresponding parts throughout the several views.

DETAILED DESCRIPTION OF THE INVENTION

The technical solutions in the embodiments of the present disclosure are explicitly described in detail below. Obviously, the described embodiments are only a part of rather than all of the embodiments of the present disclosure. Based on the embodiments in the present disclosure, all other embodiments occurred to those of ordinary skill in the art without creative work fall within the scope of the present disclosure.

The present disclosure provides a piezoelectricity ceramic material which comprises main components that are represented by a general chemical formula of $PbZr_aTi_b(Nb_{2/3}Ni_{1/3})_{1-a-b}O_3 + c\%BaW_{0.5}Cu_{0.5}O_3 + d\%SiO_2$ and satisfy the following condition:

$0.1 \leq a \leq 0.4, 0.2 \leq b \leq 0.5, 0.1 \leq c \leq 3, 0.05 \leq d \leq 1$.

The properties of the piezoelectricity ceramic material is adjusted by adjusting the ratio of a to b, so that the piezoelectricity ceramic material reaches high piezoelectric properties finally. The sintering temperature is reduced by adjusting the amounts of c and d and adding an assistant during pulverizing after calcination.

Also, the present disclosure provides a method for processing a piezoelectricity ceramic sinter from the aforesaid piezoelectricity ceramic material, wherein by controlling the particle sizes of the raw material and the precalcined powder and by adding a low-temperature sintering assistant, a desired low-temperature piezoelectricity ceramic sinter is obtained by casting forming; and then a desired piezoelectricity ceramic device is obtained by polarizing the piezoelectricity ceramic sinter in air with a polarization electric field ranging from 2500 to 3500 V/mm for 5 s. Specifically, the method comprises the following steps:

Step S1, material preparation: providing the components of the piezoelectricity ceramic material according to a chemical formula of $PbZr_aTi_b(Nb_{2/3}Ni_{1/3})_{1-a-b}O_3$ and pulverizing the components into a powder, the components including $Pb_3O_4$, $TiO_2$, $ZrO_2$, $Nb_2O_5$, NiO, CuO, $BaCO_3$, $WO_3$, and $SiO_2$.

The masses of the components as the raw materials are calculated according to the ratios as set forth in the chemical formula and weighed using a precision electronic balance. The median particle size of the aforesaid components is controlled below 2 μm by raw material selection or ball-mill mixing so as to improve the reactivity of the raw material.

Step S2, mixing: adding distilled water into the aforesaid processed powder in a mass ratio of 1:1, mixing them for 8 h, and then oven-drying the mixture;

The processed powder and distilled water are mixed in a ball mill so as to provide a more uniform mixing.

Step S3, calcination: calcining the aforesaid oven-dried product at 780-850° C. for 3 h to synthesize a calcined product;

Step S4, addition of low-temperature assistant and pulverizing: adding a low-temperature assistant into the calcined product according to a mass percentage of $c\%BaW_{0.5}Cu_{0.5}O_3 + d\%SiO_2$, and then pulverizing and oven-drying them to form a mixture;

Wherein, the $BaW_{0.5}Cu_{0.5}O_3$ is obtained by mixing CuO, $BaCO_3$, and $WO_3$ according to the ratio as set forth in the chemical formula and calcining them at 600-650° C. Then, the aforesaid mixture is pulverized using a ball mill, so that the median particle size distribution of the mixture is below 1 μm, and the mixture is oven-dried. Micro-bead ball milling increases the specific surface area of the powder, enhances the activity of the powder, increases the driving force of sintering, and in turn reduces the ceramic sintering temperature. The low temperature assistant forms a liquid phase in the early stage of sintering, which facilitates sintering, and in the late stage of sintering, part of the frit component enters the lattices of the principal crystalline phase, which also plays a role in doping modification.

Additionally, referring to FIG. 1 where the properties at different sintering temperatures are compared with, wherein, the curve at 1130° C. shows the properties of sintering without the low-temperature assistant, and the curve at 880-1000° C. shows the properties of sintering after the incorporation of the low-temperature assistant. It can be seen that, after adding the low-temperature assistant, with the same properties being maintained, the sintering temperature is reduced by about 200° C.

Step S5, pulping: adding a binder, a plasticizer, a dispersing agent, and a solvent into the aforesaid mixture and mixing them to form a ceramic pulp.

Wherein, the binder, plasticizer, dispersing agent, and solvent added during the pulping are as shown in Table 1 below.

TABLE 1

| Times | Name | Function | Percentage (%) | Duration |
|---|---|---|---|---|
| The First Time | Powder | | 100 | 12 H |
| | Toluene | Solvent | 30-40 | |
| | Alcohol | Solvent | 10-20 | |
| | KD-1 | Dispersing agent | 0.1-1 | |
| The Second Time | Polyvinyl butyral (PVB) | Binder | 3-8 | 12 H |
| | Dibutyl phthalate (DBP) | Plasticizer | 1-5 | |

Step S6, forming: debubbling the ceramic pulp and then casting it into a ceramic film.

There are four main methods for forming ceramic film: rolling film forming, casting forming, dry pressing forming, and hydrostatic forming. Rolling film forming is applicable to sheet members; casting forming is applicable to thinner members where the film thickness may be less than 10 μm; dry pressing forming is applicable to block members; hydrostatic forming is applicable to irregular or block members. Apart from hydrostatic forming, all the other forming methods require a binder which is about 3% relative to the weight of the raw material. After forming, it is required to remove the binder. The binder only facilitates forming, but it is a highly reducing substance, which, after forming, shall be removed to prevent it from affecting the sintering quality.

Step S7, laminating: laminating the aforesaid ceramic film to form a laminated product.

Step S8, sintering: firing the laminated product at 900-950° C. for 3 h to form a piezoelectricity ceramic sinter.

Figure 2:
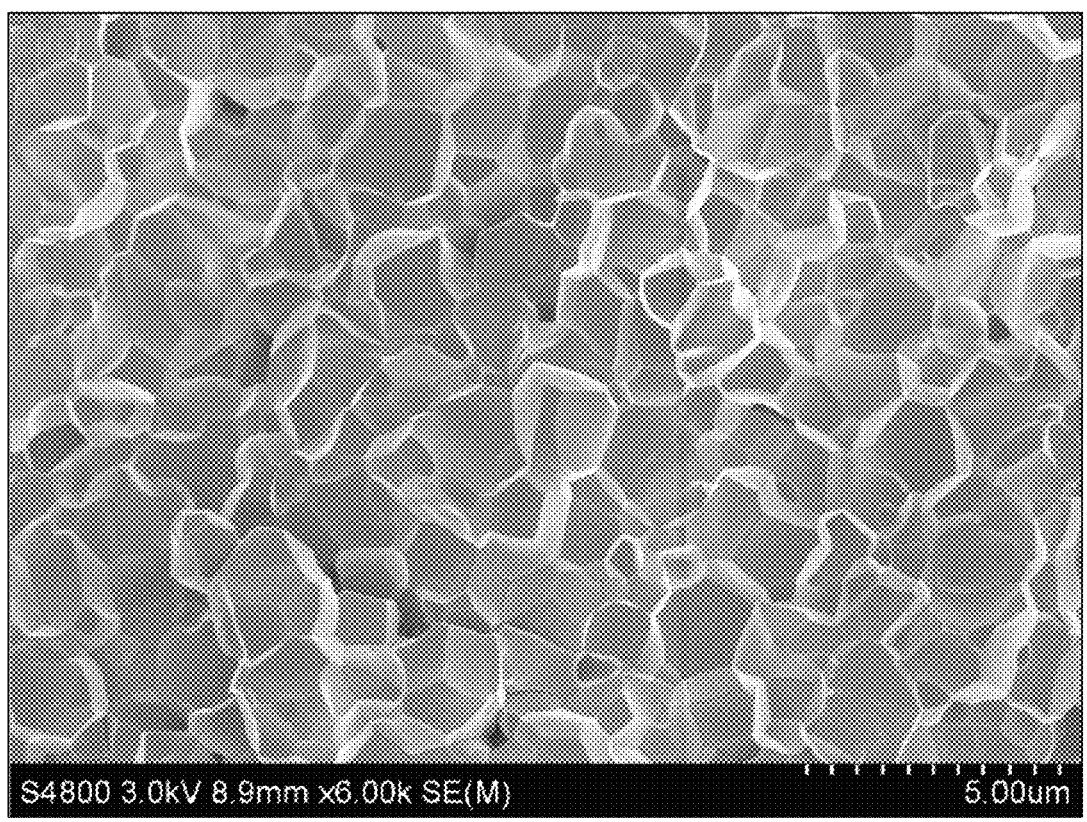
FIG. 2 is a microstructure of a ceramic cross-section of a piezoelectricity ceramic sinter of the present disclosure sintered at 920° C.
Figure 3:
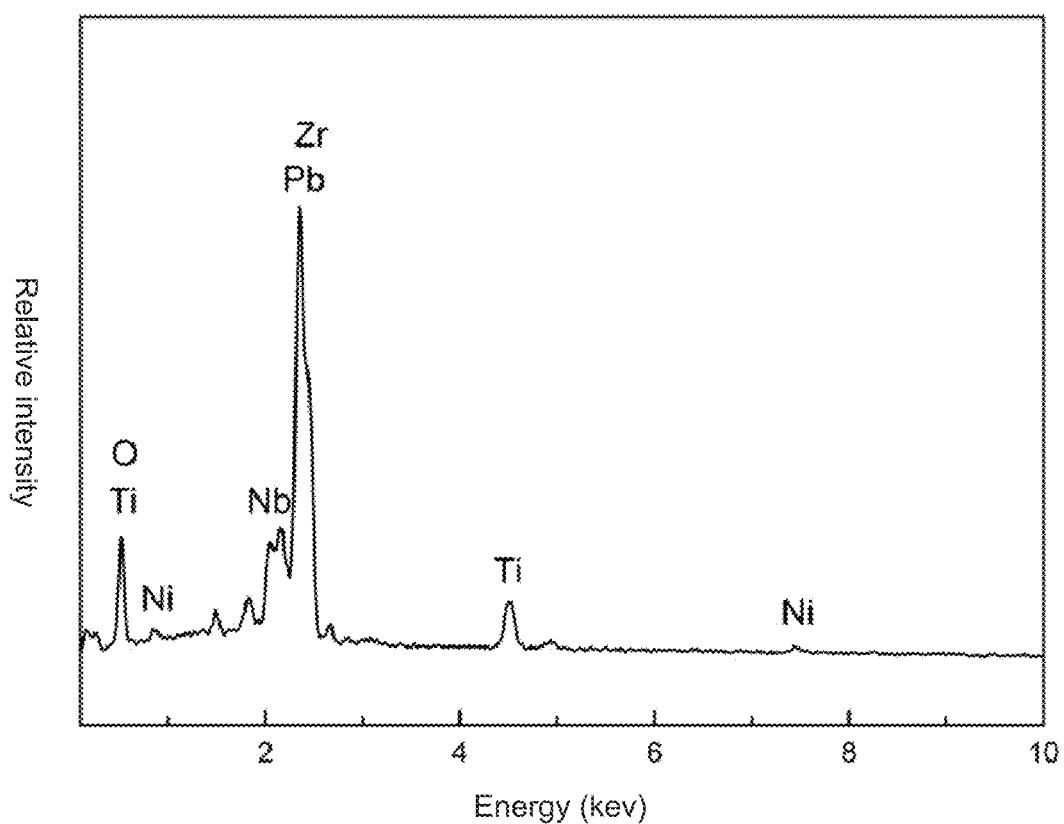
FIG. 3 is an energy spectrum of the ceramic cross-section sintered at 920° C.

As shown in FIG. 2 which shows a microstructure of a ceramic cross-section of a piezoelectricity ceramic sinter formed at 920° C. according to the aforesaid processed method. As can be seen, the ceramic is sintered compactly, the crystal size is uniform and is about 2 μm, and the crystal boundary is obvious. Additionally, an energy spectrum of a cross-section of the piezoelectricity ceramic sinter is shown in FIG. 3.

An electrode layer is formed on the piezoelectricity ceramic sinter to achieve the electropolarization of the piezoelectricity ceramic, where electrode materials such as silver, copper, gold, and platinum may be used. Method for forming the electrode layer include vacuum evaporation, chemical deposition, and the like. In the detailed description of the disclosure, a silver slurring is coated thereon and the electrode layer is fired in air.

The piezoelectricity ceramic sinter with the electrode layer is placed in air and polarized in a polarization electric field of 2500-3500 V/mm for 5 s, and then the electric field is removed, thereby obtaining a piezoelectricity ceramic device where the aforesaid piezoelectricity ceramic sinter is subjected to electrode polarization.

The piezoelectricity ceramic device is tested according to the national standard and the piezoelectric properties are calculated, wherein the test results of the samples at 920° C. are shown in Table 2 in detail.

TABLE 2

| Dielectric constant | $\epsilon_{33}^T/\epsilon_0$ | 3229 |
|---|---|---|
| Dielectric loss | $\tan\delta$ | 0.02 |
| Electromechanical coupling coefficient | $K_p\downarrow$ (radical) | 0.71 |
| | $k_{31}\downarrow$ (length) | 0.44 |
| | $k_t\downarrow$ (thickness) | 0.5 |
| Piezoelectric constant | $d_{31}$ | −323 |
| | $d_{33}$ | 588 |
| Mechanical quality factor | $Q_m$ | 69 |
| Young's modulus | $Y_{11}^E(10^{10}\,N/m^2)$ | 5.1 |
| Piezo voltage coefficient | $g_{31}(10^{-3}\,Vm/N)$ | 11.2 |
| | $g_{33}(10^{-3}\,Vm/N)$ | 20.4 |
| Frequency constant | $N_d(Hz * m)$ | 1947 |
| Wave speed | $V_t^E$ (m/s) | 2620 |
| Poisson's ratio | $\sigma$ | 0.26 |
| Density | $\rho$ (g/cm³) | 7.87 |

Wherein, the dielectric constant is calculated by measuring the sample size and LCR.

Thus, as can be seen, the particle size control and the low melting point additive of the present disclosure reduce the sintering temperature while ensuring the piezoelectric properties of the material and leading to a low cost and a simple process, which facilitates industrialized application.

Additionally, the low-temperature sintering adopted by the present disclosure reduces energy consumption and reduces the volatilization of PbO, which avoids the fluctuation of the ceramic components and the deviation from the designed composition, reduces the pollution to the environment caused by volatilization, and reduces the corrosion to the sintering machine as well. In a multi-layer device, Ag/Pd alloy is generally used as then inner electrode in order to prevent the electrode from being oxidized during the sintering, and if the sintering temperature is reduced, the proportion of Pd in the Ag/Pd alloy will be reduced, and even a pure Ag electrode can be used, which greatly reduces the device cost.

While the present invention has been described with reference to the specific embodiments, the description of the invention is illustrative and is not to be construed as limiting the invention. Various of modifications to the present invention can be made to the exemplary embodiments by those skilled in the art without departing from the true spirit and scope of the invention as defined by the appended claims.

What is claimed is:

1. A piezoelectricity ceramic material, comprising main components that are represented by a general chemical formula of $$PbZr_aTi_b(Nb_{2/3}Ni_{1/3})_{1-a-b}O_3 + c\%BaW_{0.5}Cu_{0.5}O_3 + d\%SiO_2$$

and satisfy the following condition:
$1 \leq a \leq 0.4$, $0.2 \leq b \leq 0.5$, $0.1 \leq c \leq 3$, and $0.05 \leq d \leq 1$.

2. A piezoelectricity ceramic sinter, wherein the piezoelectricity ceramic sinter is a sinter obtained by sintering the piezoelectricity ceramic material of claim 1.

3. A method for processing a piezoelectricity ceramic sinter, comprising the following steps:
   Step 1, material preparation: providing the components of a piezoelectricity ceramic material according to a chemical formula of $PbZr_aTi_b(Nb_{2/3}Ni_{1/3})_{1-a-b}O_3$ and pulverizing the components into a powder, the components including $Pb_3O_4$, $TiO_2$, $ZrO_2$, $Nb_2O_5$, NiO, CuO, $BaCO_3$, $WO_3$, and $SiO_2$;
   Step 2, mixing: adding distilled water into the aforesaid processed powder in a mass ratio of 1:1, mixing them for 8 h, and then oven-drying the mixture;
   Step 3, calcination: calcining the aforesaid oven-dried product at 780-850° C. for 3 h to synthesize a calcined product;
   Step 4, addition of low-temperature assistant and pulverizing: adding a low-temperature assistant into the calcined product according to a mass percentage of $c\%BaW_{0.5}Cu_{0.5}O_3 + d\%SiO_2$, and then pulverizing and oven-drying them to form a mixture;
   Step 5, pulping: adding a binder, a plasticizer, a dispersing agent, and a solvent into the aforesaid mixture and mixing them to form a ceramic pulp;
   Step 6, forming: debubbling the ceramic pulp and then casting it into a ceramic film;
   Step 7, laminating: laminating the aforesaid ceramic film to form a laminated product;
   Step 8, sintering: firing the laminated product at 900-950° C. for 3 h to form a piezoelectricity ceramic sinter.

4. The method for processing a piezoelectricity ceramic sinter of claim 3, wherein in the step of material preparation, the components are pulverized into a powder by raw material selection or ball-mill mixing.

5. The method for processing a piezoelectricity ceramic sinter of claim 3, wherein in the step of material preparation, the median particle size of the powder is controlled below 2 μm.

6. The method for processing a piezoelectricity ceramic sinter of claim 3, wherein in the step of mixing, the processed powder and the distilled water are mixed in a ball mill.

7. The method for processing a piezoelectricity ceramic sinter of claim 3, wherein in the step of addition of low-temperature assistant and pulverizing, the $BaW_{0.5}Cu_{0.5}O_3$ is obtained by mixing CuO, $BaCO_3$, $WO_3$ according to the ratio as set forth in the chemical formula and calcining them at 600-650° C.

8. The method for processing a piezoelectricity ceramic sinter of claim 3, wherein in the step of addition of low-temperature assistant and pulverizing, the median particle size distribution of the particle size of the pulverized mixture is below 1 μm.

9. A piezoelectricity ceramic device formed from the piezoelectricity ceramic sinter through electrode polarization, wherein the method for processed the piezoelectricity ceramic sinter comprising the following steps:
   Step 1, material preparation: providing the components of a piezoelectricity ceramic material according to a chemical formula of $PbZr_aTi_b(Nb_{2/3}Ni_{1/3})_{1-a-b}O_3$ and pulverizing the components into a powder, the components including $Pb_3O_4$, $TiO_2$, $ZrO_2$, $Nb_2O_5$, NiO, CuO, $BaCO_3$, $WO_3$, and $SiO_2$;
   Step 2, mixing: adding distilled water into the aforesaid processed powder in a mass ratio of 1:1, mixing them for 8 h, and then oven-drying the mixture;
   Step 3, calcination: calcining the aforesaid oven-dried product at 780-850° C. for 3 h to synthesize a calcined product;
   Step 4, addition of low-temperature assistant and pulverizing: adding a low-temperature assistant into the calcined product according to a mass percentage of $c\%BaW_{0.5}Cu_{0.5}O_3 + d\%SiO_2$, and then pulverizing and oven-drying them to form a mixture;
   Step 5, pulping: adding a binder, a plasticizer, a dispersing agent, and a solvent into the aforesaid mixture and mixing them to form a ceramic pulp;
   Step 6, forming: debubbling the ceramic pulp and then casting it into a ceramic film;
   Step 7, laminating: laminating the aforesaid ceramic film to form a laminated product;
   Step 8, sintering: firing the laminated product at 900-950° C. for 3 h to form a piezoelectricity ceramic sinter.

10. The piezoelectricity ceramic device of claim 9, wherein the piezoelectricity ceramic device is obtained by polarization in air with a polarization electric field ranging from 2500 to 3500 V/mm for 5 s.

* * * * *